(12) United States Patent
Kato et al.

(10) Patent No.: US 7,829,207 B2
(45) Date of Patent: Nov. 9, 2010

(54) MANUFACTURE METHOD FOR ZNO BASED COMPOUND SEMICONDUCTOR CRYSTAL AND ZNO BASED COMPOUND SEMICONDUCTOR SUBSTRATE

(75) Inventors: Hiroyuki Kato, Meguro-ku (JP);
 Michihiro Sano, Meguro-ku (JP);
 Katsumi Maeda, Ota-ku (JP); Hiroshi Yoneyama, Sawa-gun (JP); Takafumi Yao, Sendai (JP); Meoung Whan Cho, Sendai (JP)

(73) Assignees: Stanley Electric Co., Ltd. (JP); Tokyo Denpa Co., Ltd. (JP); Tohoku University (JP)

( * ) Notice: Subject to any disclaimer, the term of this patent is extended or adjusted under 35 U.S.C. 154(b) by 0 days.

(21) Appl. No.: 12/239,739

(22) Filed: Sep. 27, 2008

(65) Prior Publication Data

US 2009/0045398 A1 Feb. 19, 2009

Related U.S. Application Data

(62) Division of application No. 11/509,063, filed on Aug. 24, 2006, now Pat. No. 7,438,762.

(30) Foreign Application Priority Data

Aug. 24, 2005 (JP) .............................. 2005-243472

(51) Int. Cl.
 *B32B 9/00* (2006.01)
 *B32B 19/00* (2006.01)
 *C30B 29/16* (2006.01)
 *C30B 29/46* (2006.01)

(52) U.S. Cl. .................. 428/698; 117/944; 117/956; 428/689; 428/336; 428/697; 428/699; 428/701; 428/702

(58) Field of Classification Search .................. 117/2, 117/3, 944, 956; 428/689, 697–702, 336
See application file for complete search history.

(56) References Cited

U.S. PATENT DOCUMENTS 6,527,858 B1 * 3/2003 Yoshida et al. ............... 117/108

(Continued)

FOREIGN PATENT DOCUMENTS

EP  1 349 203 A2  10/2003
JP  2003-282602 A  10/2003

OTHER PUBLICATIONS

Kato, et al., "Effects of slight misorientation of GaN templates on Molecular-eam-epitaxy growth of ZnO", Journal of Applied Physics AIP USA vol. 92, No. 4, Aug. 15, 2002.

(Continued)

*Primary Examiner*—Robert M Kunemund
*Assistant Examiner*—G. Nagesh Rao
(74) *Attorney, Agent, or Firm*—Chen Yoshimura LLP (57) ABSTRACT

A manufacture method that can manufacture ZnO based compound semiconductor crystal of good quality. A ZnO substrate is prepared to have a principal surface made of a plurality of terraces of (0001) planes arranged stepwise along an m-axis direction, the envelop of the principal surface being inclined relative to the (0001) plane by about 2 degrees or less. ZnO based compound semiconductor crystal is grown on the principal surface.

6 Claims, 6 Drawing Sheets

U.S. PATENT DOCUMENTS

| | | | | |
|---|---|---|---|---|
| 6,624,441 B2* | 9/2003 | Cantwell et al. | ............... | 257/43 |
| 6,627,552 B1* | 9/2003 | Nishio et al. | ................. | 438/694 |
| 6,673,478 B2* | 1/2004 | Kato et al. | ................... | 428/698 |
| 6,773,836 B2* | 8/2004 | Kim et al. | .................... | 428/704 |
| 6,936,188 B1* | 8/2005 | Haga | ..................... | 252/301.16 |
| 7,001,791 B2* | 2/2006 | Kryliouk et al. | ............... | 438/46 |
| 7,400,030 B2* | 7/2008 | Lu et al. | ..................... | 257/628 |
| 7,438,762 B2* | 10/2008 | Kato et al. | .................... | 117/94 |
| 7,597,757 B2* | 10/2009 | Conley et al. | ................. | 117/84 |
| 2003/0186088 A1* | 10/2003 | Kato et al. | .................. | 428/698 |
| 2007/0108866 A1* | 5/2007 | Conley et al. | ............... | 310/311 |
| 2007/0152233 A1* | 7/2007 | Kato et al. | .................. | 257/103 |
| 2009/0224240 A1* | 9/2009 | Shinagawa et al. | ............ | 257/43 |
| 2009/0267065 A1* | 10/2009 | Horio | .......................... | 257/43 |
| 2010/0064966 A1* | 3/2010 | Horio et al. | ................. | 117/104 |
| 2010/0102309 A1* | 4/2010 | Nakahara et al. | .............. | 257/43 |

OTHER PUBLICATIONS

Ko H-J, et al., "Improvement of the quality of ZnO substrates by annealing", Journal of Crystal Growth, vol. 269, No. 2-3, Sep. 1, 2004.

European Search Report dated Jan. 16, 2007 from the EPO in the counterpart EP application.

Communication form from the EPO in the counterpart EP application dated Jan. 16, 2007.

* cited by examiner

MANUFACTURE METHOD FOR ZNO BASED COMPOUND SEMICONDUCTOR CRYSTAL AND ZNO BASED COMPOUND SEMICONDUCTOR SUBSTRATE

This application is a Division of Ser. No. 11/509,063 filed Aug. 24, 2006 now U.S. Pat. No. 7,438,762.

CROSS REFERENCE TO RELATED APPLICATION

This application is based on and claims priority of Japanese Patent Application No. 2005-243472 filed on Aug. 24, 2005, the entire contents of which are incorporated herein by reference.

BACKGROUND OF THE INVENTION

A) Field of the Invention

The present invention relates to a manufacture method for zinc oxide (ZnO) based compound semiconductor crystal and a ZnO based compound semiconductor substrate.

B) Description of the Related Art

ZnO based compound semiconductor such as ZnO is one of wide gap semiconductors and has a large exciton binding energy of about 60 meV. If a light emission element is formed by using ZnO based compound semiconductor as an active layer material, it should be possible to obtain a light emission element having an optical emission efficiency higher than that of a light emission element using gallium nitride based (GaN based) compound semiconductor as an active layer material.

ZnO based compound semiconductor material is therefore expected to be used as the material of an active layer of a blue color light emission element or ultraviolet light emission element.

In order to use ZnO based compound semiconductor material as the material of an active layer of a light emission element, it is necessary first to form a single crystal layer of this compound semiconductor.

A single crystal layer of ZnO compound semiconductor may be formed directly or via a template layer on an a-plane sapphire substrate or c-plane sapphire substrate by molecular beam epitaxy (MBE) or laser ablation vapor deposition, for example.

The crystalline structure of ZnO based compound semiconductor is a Wurtzite structure which is one of the hexagonal systems. Crystal growth on an a-plane sapphire substrate or c-plane sapphire substrate generally occurs along the −c-axis (oxygen (O) plane) direction. If a gallium (Ga) plane GaN film is used as a template layer, it is possible to grow ZnO based compound semiconductor along its + c-axis (zinc (Zn) plane) direction. It is also possible to grow the crystal along its + c-axis direction on a Zn plane ZnO substrate. In order to use ZnO based compound semiconductor as the material of an active layer of, e.g., a light emission element, it is desirable to form a single crystal layer with less crystalline defects. However, undesirable crystalline defects are often formed in a single crystal of ZnO based compound semiconductor.

Some of the present inventors have previously invented a crystal growth substrate, which is suitable for growing ZnO based compound semiconductor of a hexagonal system crystal structure. See, e.g., JP-A-2003-282602 and its counterpart U.S. Pat. No. 6,673,478, both of which are herein incorporated by reference in their entireties. This crystal growth substrate uses a sapphire substrate, but the sapphire substrate has no electric conductivity and an electrode cannot be formed on the substrate bottom.

SUMMARY OF THE INVENTION

An object of the present invention is to provide a manufacture method for ZnO based compound semiconductor crystal capable of forming ZnO based compound semiconductor crystal of good quality.

Another object of the present invention is to provide a ZnO based compound semiconductor substrate of good quality.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, according to one aspect of the present invention, there is provided a manufacture method for ZnO based compound semiconductor crystal including the steps of (a) preparing a ZnO substrate having a principal surface made of a plurality of terraces of (0001) planes disposed stepwise in a sequence along an m-axis direction, an envelope of the terraces having an inclination angle of about 2 degrees or less relative to the (0001) plane, and (b) growing ZnO based compound semiconductor crystal over said principal surface.

According to another aspect of the present invention, there is provided a ZnO based compound semiconductor substrate including a base substrate of ZnO single crystal having a principal surface made of a plurality of terraces of (0001) planes disposed stepwise in a sequence along an m-axis direction, an envelop of the principal surface having an inclination angle of about 2 degrees or less relative to the (0001) plane, and an epitaxially grown layer made of ZnO based compound semiconductor formed over the principal surface of said base substrate.

It was also found to be preferable to grow ZnO based compound semiconductor along its + c-axis (Zn plane) direction in order to improve crystallinity of ZnO based compound semiconductor crystal.

By using the manufacture method for ZnO based compound semiconductor crystal according to one aspect of the present invention, it is possible to grow ZnO based compound semiconductor crystal along its + c-axis (Zn plane) direction resulting in ZnO based compound semiconductor crystal of good quality.

The ZnO based compound semiconductor substrate according to another aspect of the present invention is a semiconductor substrate of good quality and has a ZnO based compound semiconductor crystal layer of good quality.

In another aspect, the present invention provides a manufacture method for ZnO based compound semiconductor crystal including the steps of (a) preparing a ZnO substrate having a principal surface made of a plurality of terraces of (0001) planes disposed stepwise in a sequence, an envelope of the terraces being inclined relative to the (0001) plane, and (b) epitaxially growing ZnO based compound semiconductor crystal over said principal surface.

In still another aspect, the present invention provides a ZnO based compound semiconductor substrate including a base substrate of ZnO single crystal having a principal surface made of a plurality of terraces of (0001) planes disposed stepwise in a sequence, an envelop of the terraces being inclined relative to the (0001) plane, and an epitaxially grown layer made of ZnO based compound semiconductor formed over the principal surface of said base substrate.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DESCRIPTION OF THE PREFERRED EMBODIMENTS

Figure 1:
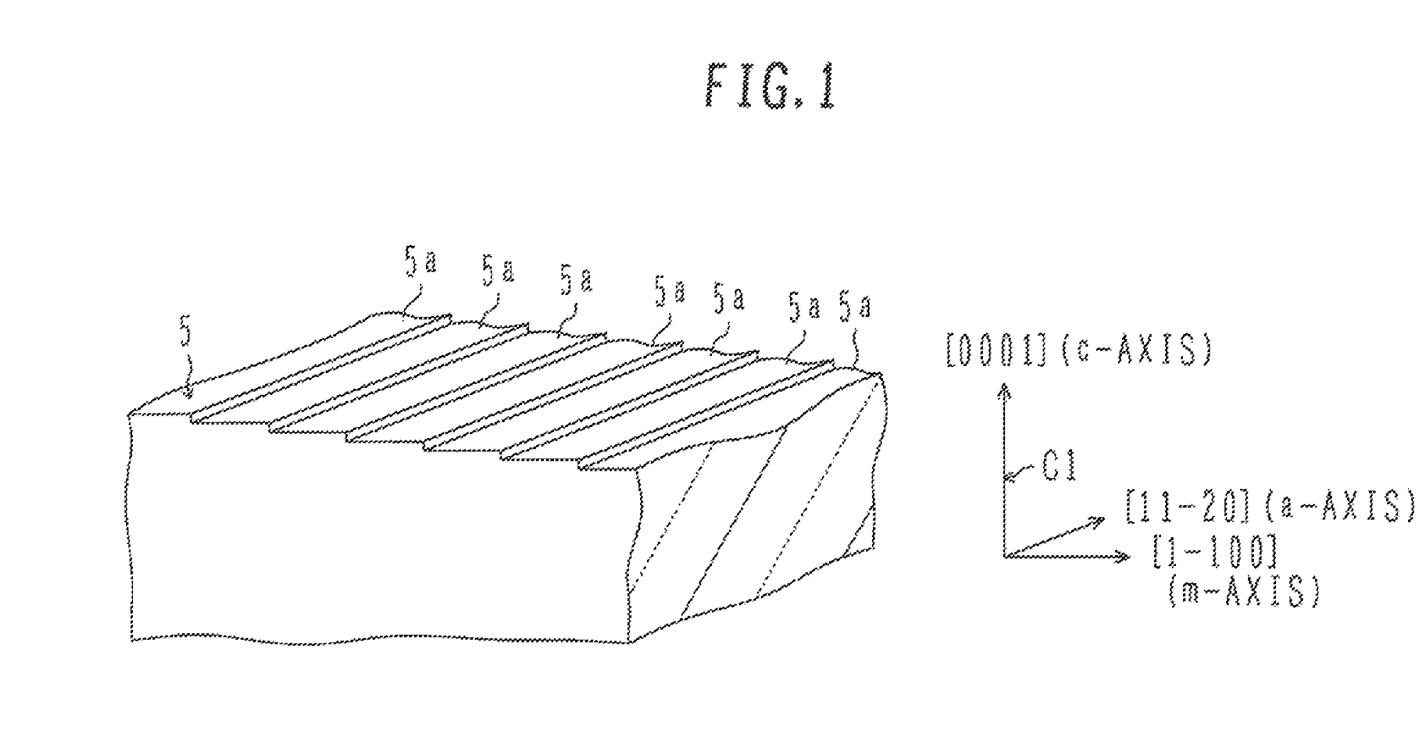
FIG. 1 is a schematic perspective view of a crystal growth substrate for growing ZnO based compound semiconductor crystal according to an embodiment of the present invention.
Figure 2:
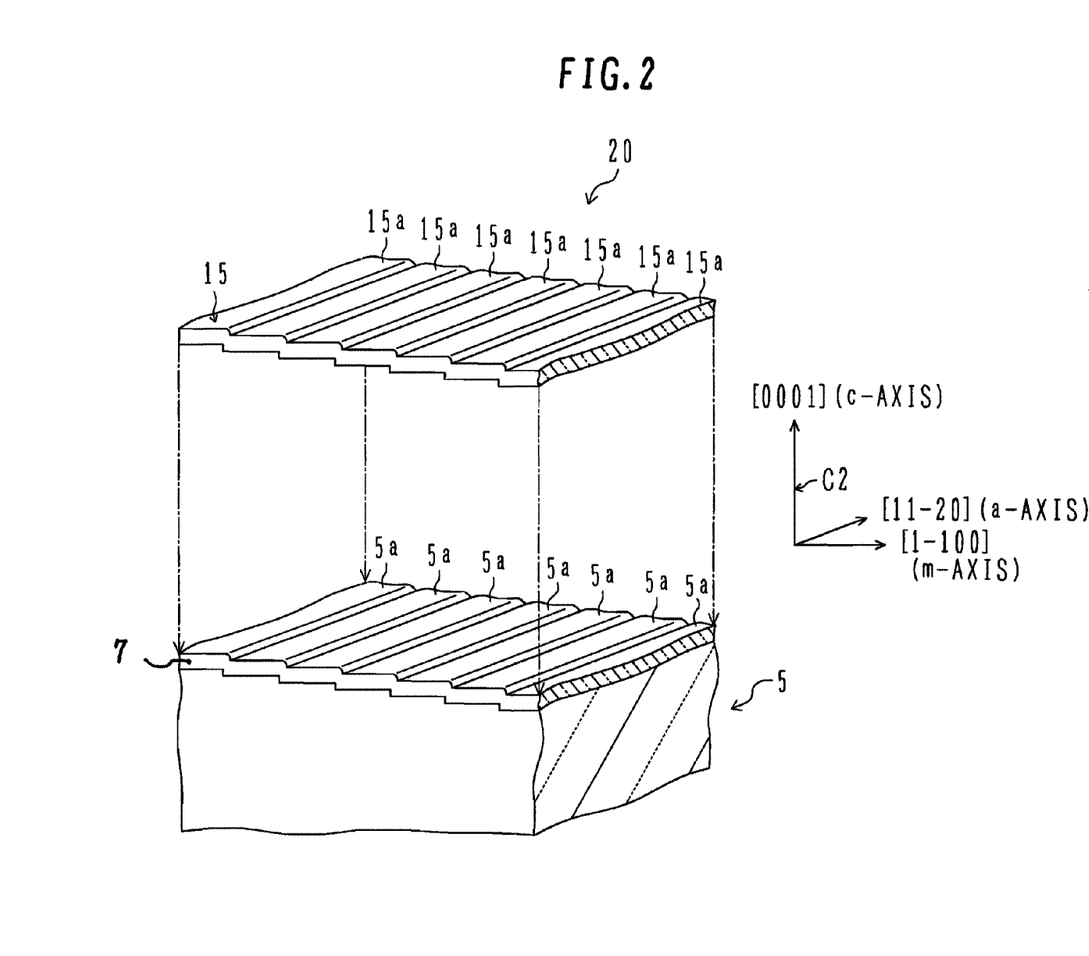
FIG. 2 is a schematic perspective view of a ZnO based compound semiconductor substrate according to an embodiment of the present invention.

With reference to FIGS. 1 and 2, a manufacture method for ZnO based compound semiconductor crystal according to an embodiment of the present invention is described.

FIG. 1 is a schematic perspective view showing a crystal growth substrate 5 for growing ZnO based compound semiconductor crystal according to the embodiment.

The crystal growth substrate 5 is made of ZnO single crystal having a hexagonal system Wurtzite structure. In FIG. 1 (and FIG. 2), a coordinate system C1 showing the directions of crystal axes (a-axis, c-axis and m-axis) of the crystal growth substrate 5 is shown. In the coordinate system C1, the a-, c- and m-axes cross at a right angle, the c-axis being represented by Miller indices [0001], the m-axis being represented by Miller indices [1-100] and the a-axis being represented by Miller indices [11-20]. Although a negative value is represented by adding a "bar" over a numerical value according to the usual coding scheme of Miller index, in the present application, a minus sign "−" is added to the left to indicate a negative numerical value.

The principal surface of the crystal growth substrate 5 is constituted of a number of first terraces 5a of the (0001) planes disposed stepwise in a sequence along the m-axis direction of ZnO single crystal, and steps coupling adjacent first terraces 5a. The first terrace 5a lies in a ZnO plane.

The inclination angle (the inclination angle of the envelope of the first terraces measured from the (0001) plane; i.e., the overall inclination angle of the principal surface) between the upper first terrace 5a and the lower first terrace 5a is preferably set to about 2 degrees or smaller, or more preferably, set to between about 0.1 degrees and about 1 degree.

The height of one step is set to, for example, the thickness of a two-molecule layer (approximately 0.52 nm).

The crystal growth substrate (ZnO substrate) 5 having the first terraces 5a can be formed by processing a ZnO substrate having a flat (0001) surface by oblique polishing and annealing in an oxygen atmosphere, or by like method.

The annealing conditions for forming a plurality of first terraces on the crystal growth substrate (ZnO substrate) 5 in the case of annealing in an oxygen atmosphere are, for example, at 1000° C. and for one hour.

The crystalline structure of the crystal growth substrate (ZnO substrate) 5 and the inclination angle of the principal surface with respect to the (0001) plane as a reference plane can be confirmed, for example, by using an X-ray diffraction apparatus.

A manufacture method for ZnO based compound semiconductor crystal will be described by taking as an example the case in which a zinc oxide (ZnO) single crystal layer is formed by MBE. Prior to executing MBE, thermal cleaning (heat treatment) is generally performed. Thermal cleaning is performed, for example, at about 600° C. to about 1000° C. for about 30 minutes in vacuum.

The crystal growth substrate 5 is set to a substrate holder in a growth chamber of an MBE system, a substrate temperature is set to about 300° C. to about 500° C. (e.g., 350° C.), and a zinc (Zn) beam (Zn molecular beam) and an oxygen (O) radical beam (oxygen radical molecular beam) are radiated to the crystal growth substrate 5 to form a zinc oxide (ZnO) buffer layer having a thickness of about 30 nm to about 100 nm.

Thereafter, application of the Zn beam and the O radical beam is stopped in order to improve the flatness of the ZnO buffer layer. Improvement on the flatness can be realized by heat treatment (high temperature cleaning), for example, at a substrate temperature of about 700° C. to about 1000° C. for about 10 minutes to about 30 minutes.

Then, the substrate temperature is set to a ZnO crystal growth temperature, e.g., at about 650° C. to about 700° C., and the Zn beam and the O radical beam are simultaneously radiated to the ZnO buffer layer to grow ZnO crystal on the ZnO buffer layer to about 1 μm along the +c-axis (zinc (Zn) plane) direction.

FIG. 2 is a perspective view schematically showing a ZnO based compound semiconductor substrate according to an embodiment of the present invention. A ZnO based compound semiconductor substrate 20 shown in FIG. 2 may be manufactured by the processes described above with reference to FIG. 1.

The ZnO based compound semiconductor substrate 20 has a crystal growth substrate (a base substrate) 5 and a ZnO based compound semiconductor crystal layer 15 grown on the crystal growth substrate 5. If desired, a buffer layer 7 made of ZnO based compound semiconductor and having a thickness of about 30 nm to about 100 nm may be formed between the crystal growth substrate 5 and the ZnO based compound semiconductor crystal layer 15.

Similar to FIG. 1, FIG. 2 shows a coordinate system C2 indicating the directions of the crystal axes (a-axis, c-axis and m-axis) of the ZnO based compound semiconductor crystal layer 15. In the coordinate system C2, the a-, c- and m-axes cross at the right angle, the c-axis being represented by Miller indices [0001], the m-axis being represented by Miller indices [1-100] and the a-axis being represented by Miller indices [11-20]. The a-axis, m-axis, and c-axis of the ZnO based compound semiconductor crystal layer 15 are parallel to the a-axis, m-axis, and c-axis of the crystal growth substrate (ZnO substrate) 5, respectively.

The ZnO based compound semiconductor crystal layer 15 grows on the crystal growth substrate (ZnO substrate) 5 in the +c-axis (Zn plane) direction, and is constituted of a number of second terraces 15a having (0001) planes disposed stepwise in a sequence along the m-axis direction, and steps coupling adjacent second terraces 15a.

Since the ZnO based compound semiconductor crystal layer 15 is epitaxially grown, the inclination angle between the second terraces 15a at the upper and lower levels can be adjusted to about 2 degrees or smaller, or more preferably between about 0.1 degrees and about 1 degree by appropriately selecting the inclination angle of the crystal growth substrate (base substrate) 5 used as the growth base.

The height of one step is set to, for example, the thickness of a two-molecule layer (approximately 0.52 nm).

The crystalline structure of the ZnO based compound semiconductor crystal layer 15 and the above-mentioned inclination angle can be confirmed, for example, by using an X-ray diffraction apparatus.

The present inventors have discovered that a high-quality ZnO based compound semiconductor crystal layer 15 can be formed by growing a ZnO based compound semiconductor crystal layer on the crystal growth substrate 5 having an angularly offset surface profile along the m-axis or a-axis direction.

FIGS. 3A to 3J are AFM (atomic force microscope) images taken with AFM by the present inventors, showing the surfaces of ZnO single crystal layers grown on ZnO (0001) substrates having an inclined surface along the m-axis or the a-axis (substrate whose principal surface is constituted of terraces exposing (0001) planes).

Each image in FIGS. 3A, 3C, 3E, 3G and 3I shows the surface of the ZnO single crystal layer in an area of 5 μm×5 μm. Each image in FIGS. 3B, 3D, 3F, 3H and 3J shows the surface of the ZnO single crystal layer in an area of 1 μm×1 μm.

Figure 3A:
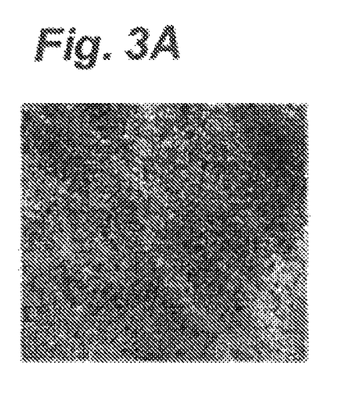
FIGS. 3A to 3J are atomic force microscope (AFM) images taken by AFM showing the surfaces of ZnO single crystal layers grown on ZnO (0001) substrates having various surface inclination angles along the m-axis or the a-axis.
Figure 3B:
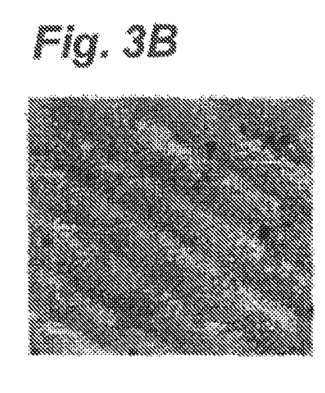

Reference is made to FIGS. 3A and 3B. These two photographs show AFM images of the surface of a ZnO single crystal layer grown on a ZnO substrate having a surface inclination angle of 0.2 degrees along the m-axis.

The RMS (root-mean-square) surface roughness in the area of 5 μm×5 μm shown in FIG. 3A was 0.4 nm, whereas the RMS surface roughness in the area of 1 μm×1 μm shown in FIG. 3B was 0.3 nm. The surface of the ZnO single crystal layer grown on the ZnO substrate having a surface inclination angle of 0.2 degrees along the m-axis is therefore substantially flat and provides excellent surface properties.

Figure 3C:
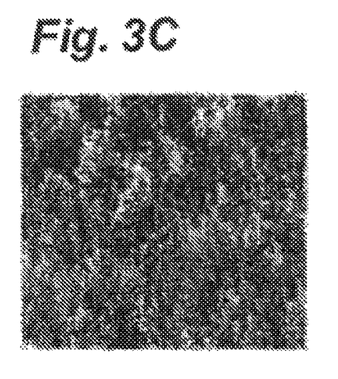
Figure 3D:
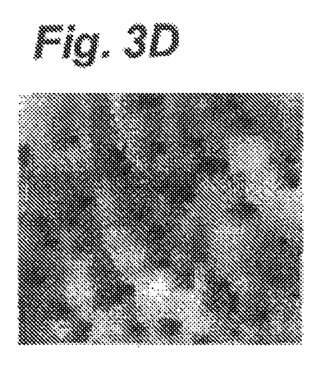

Reference is made to FIGS. 3C and 3D. These two photographs show AFM images of the surface of a ZnO single crystal layer grown on a ZnO substrate having a surface inclination angle of 2 degrees along the m-axis.

The RMS surface roughness in the area of 5 μm×5 μm shown in FIG. 3C was 1.3 nm, whereas the RMS surface roughness in the area of 1 μm×1 μm shown in FIG. 3D was 1.0 nm. The surface is sufficiently flat and provides excellent surface properties, although the roughness is large as compared to that of the ZnO single crystal layer grown on the ZnO substrate having a surface inclination angle of 0.2 degrees along the m-axis.

Figure 3E:
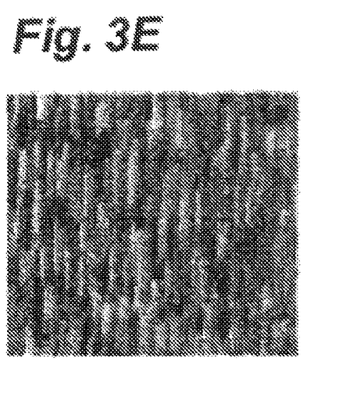
Figure 3F:
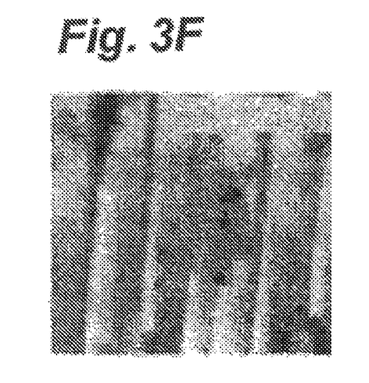

Reference is made to FIGS. 3E and 3F. These two photographs show AFM images of the surface of a ZnO single crystal layer grown on a ZnO substrate having a surface inclination angle of 4 degrees along the m-axis.

The RMS surface roughness in the area of 5 μm×5 μm shown in FIG. 3E was 4.0 nm, whereas the RMS surface roughness in the area of 1 μm×1 μm shown in FIG. 3F was 2.2 nm. As compared to the surface of the ZnO single crystal layer grown on the ZnO substrate having a surface inclination angle of 2 degrees along the m-axis, the surface roughness of this sample is larger, which may limit application of this substrate to certain device structures.

Figure 3G:
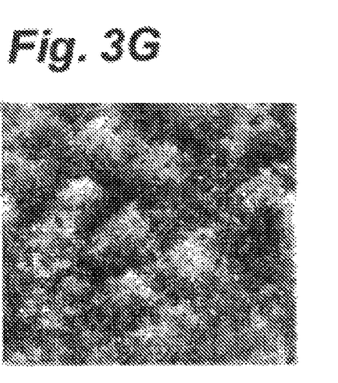
Figure 3H:
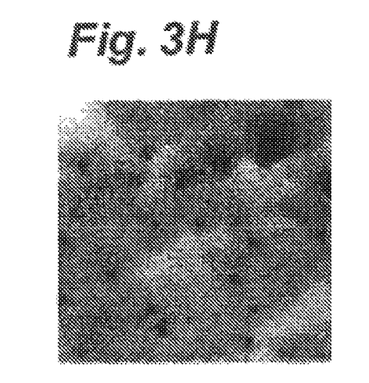

Reference is made to FIGS. 3G and 3H. These two photographs show AFM images of the surface of a ZnO single crystal layer grown on a ZnO substrate having a surface inclination angle of 2 degrees along the a-axis.

The RMS surface roughness in the area of 5 μm×5 μm shown in FIG. 3G was 2.9 nm, whereas the RMS surface roughness in the area of 1 μm×1 μm shown in FIG. 3H was 1.9 nm. As compared to the surface of the ZnO single crystal layer grown on the ZnO substrate having the same surface inclination angle of 2 degrees along the m-axis, the surface roughness is larger. It can be said that the inclined surface along the m-axis is more effective than the inclined surface along the a-axis from a perspective of surface roughness.

Figure 3I:
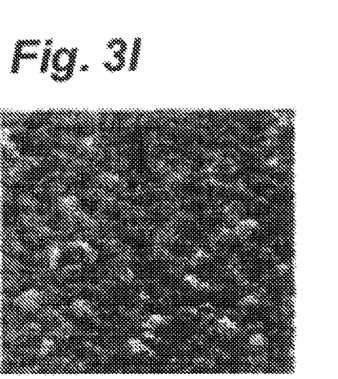
Figure 3J:
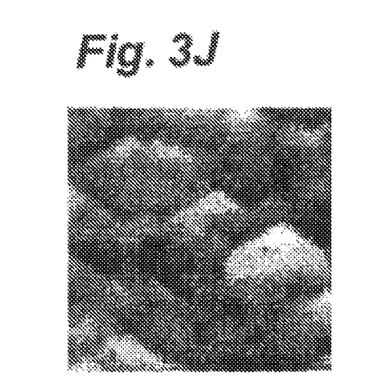

Reference is made to FIGS. 3I and 3J. These two photographs show AFM images of the surface of a ZnO single crystal layer grown on a ZnO substrate having a surface inclination angle of 4 degrees along the a-axis.

The RMS surface roughness in the area of 5 μm×5 μm shown in FIG. 3I was 4.1 nm, whereas the RMS surface roughness in the area of 1 μm×1 μm shown in FIG. 3J was 3.2 nm. The surface roughness is large as compared to the cases of the surface inclination angle of 2 degrees along the a-axis and the surface inclination angle of 4 degrees along the m-axis.

The present inventors have measured the RMS surface roughness of various ZnO single crystal layers formed on ZnO (0001) substrates having a variety of inclination angles along the m- and a-axis in addition to the above samples. The results of the evaluation are described as follows.

Figure 4:
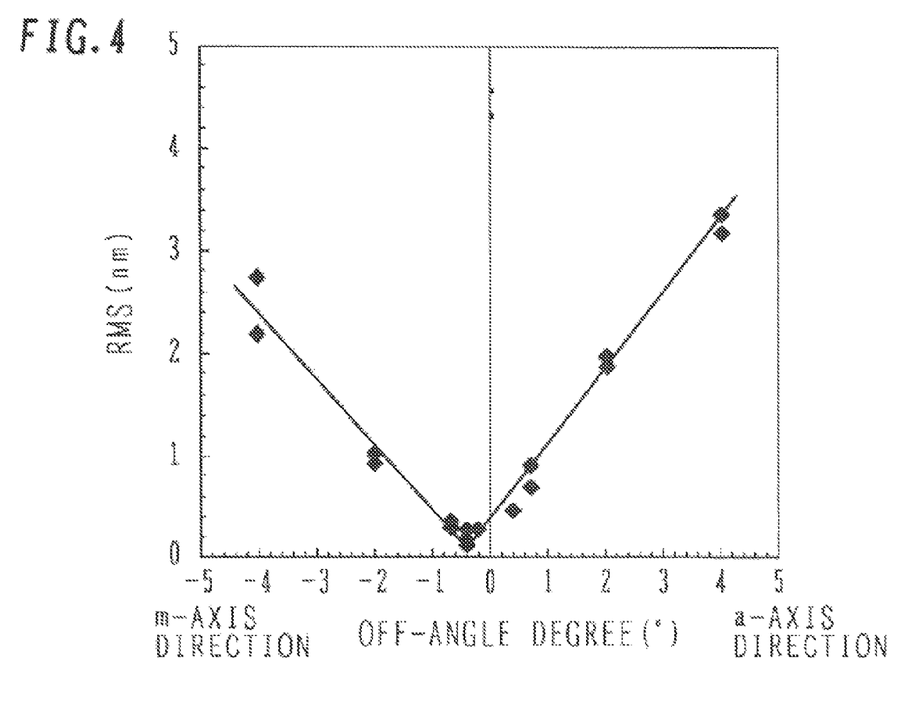
FIG. 4 is a graph showing a measured dependency of a root-mean-square (RMS) surface roughness of various ZnO single crystal layers upon the surface inclination angle of the underlying base substrate.

FIG. 4 is a graph showing a measured dependency of the root-mean-square (RMS) surface roughness of various ZnO single crystal layers upon the surface inclination angle of the underlying base substrate.

The horizontal axis of the graph represents the surface inclination angle of the underlying ZnO (0001) substrate in the unit of "degree (°)". The right direction horizontal axis (positive numbers) represents surface inclination angles along the a-axis direction, and the left direction horizontal axis (negative numbers) represents surface inclination angles along the m-axis direction. The vertical axis of the graph represents the measured RMS surface roughness in the area of 1 μm×1 μm in the unit of "nm".

It can be seen from gradients of the graph that a flatter surface profile can be relatively easily obtained by setting the surface inclination angle of the underlying ZnO substrate along the m-axis direction than along the a-axis direction.

As shown in the graph of FIG. 4, at a surface inclination angle of about 0.4 degrees along the m-axis direction, a ZnO single crystal layer having the flattest surface profile can be obtained. It can be seen from FIG. 4 that a range of the inclination angle in which the RMS surface roughness becomes 1 nm or smaller is about 2 degrees or less along the m-axis and about 0.8 degrees or less along the a-axis. It can also be seen that a range of the inclination angle in which the RMS surface roughness becomes 0.5 nm or smaller is about 1 degrees or less along the m-axis.

At a surface inclination angle of 1 degree or less along the m-axis, terraces and steps (0.52 nm) were clearly observed on the surface of a ZnO single crystal layer, and step bunching did not occur. At a surface inclination angle of 4 degrees along the m-axis, step bunching was observed.

The present inventors conducted further experiments under various conditions and have found that a lateral growth speed of the ZnO single crystal layer is faster along the a-axis direction than along the m-axis direction, and that terraces are broadened more along the a-axis direction. It can therefore be considered that the surface inclination angle is preferably set along the m-axis unless special device design considerations require otherwise.

The present inventors measured electron mobility of ZnO single crystal layers grown on ZnO (0001) substrates having various surface inclination angles along the m- or a-axis direction.

Figure 5:
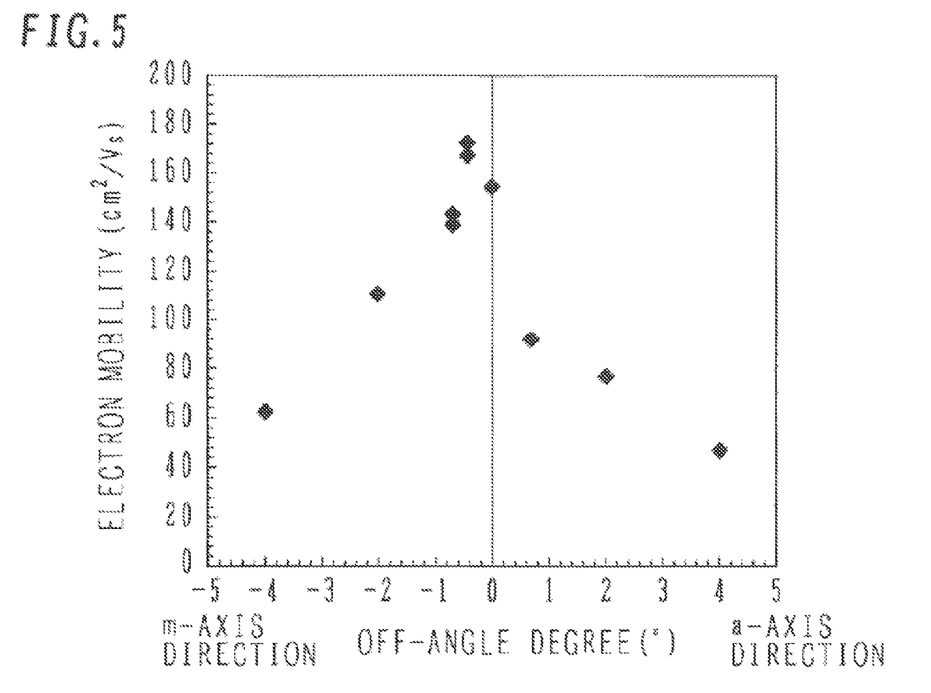
FIG. 5 shows measurement results of a dependency of the electron mobility in various ZnO single crystal layers upon the surface inclination angle of the underlying base substrate.

FIG. 5 shows measurement results of a dependency of the electron mobility in ZnO single crystal layers upon the surface inclination angles.

The horizontal axis represents surface inclination angles in the unit of "degree (°)". The right direction horizontal axis (positive numbers) represents surface inclination angles along the a-axis direction, and the left direction horizontal axis (negative numbers) represents surface inclination angles along the m-axis direction. The vertical axis represents the electron mobility in the unit of "$cm^2/V$ s". Impurities were not doped in the ZnO single crystal layers.

It can be understood from FIG. 5 that a ZnO single crystal layer having a higher electron mobility and therefore having a better crystallinity can be relatively easily obtained by setting the surface inclination angle of the underlying ZnO substrate along the m-axis direction rather than along the a-axis.

As shown in FIG. 5, at a surface inclination angle of about 0.4 degrees along the m-axis direction, a ZnO single crystal layer having the highest electron mobility and therefore the best crystallinity can be obtained. At a surface inclination angle of about 2 degrees or less along the m-axis direction, the electron mobility in the ZnO single crystal layer exceeds 100 $cm^2/V$ s. It is also found that at a surface inclination angle of about 1 degree or less, the electron mobility is 130 $cm^2/V$ s or higher.

As seen from FIG. 5, the electron mobility was about 60 $cm^2/V$ s at a surface inclination angle of 4 degrees along the m-axis direction. AFM analysis showed that the ZnO single crystal layer in this case exhibits a relatively poor crystallinity.

As seen from FIG. 5, the electron mobility was about 100 $cm^2/V$ s or smaller even at a surface inclination angle of about 0.7 degrees along the a-axis direction, indicating a relatively poor crystallinity.

It can be considered from the measurement results shown in FIGS. 4 and 5 that in order to improve the surface roughness and the electron mobility, it is preferable to set the surface inclination angle to about 2 degrees or less along the m-axis, or more preferably, between about 0.1 degrees and about 1 degree. The reason for setting this preferred lower limit of the inclination angle to about 0.1 degrees or more is that if the surfaced inclination angle is set smaller than about 0.1 degrees, ZnO single crystal of good crystallinity may not be consistently formed on the first terraces.

Moreover, if the surface inclination angle exceeds about 2 degrees in the m-axis direction, the surface morphology of a ZnO single crystal substrate may be degraded by thermal cleaning (heat treatment), which is generally performed prior to the growth of ZnO single crystal, and therefore, ZnO single crystal of good crystallinity may not be consistently formed on the first terraces.

The present invention is applicable to manufacture for ZnO based compound semiconductor crystal.

The ZnO based compound semiconductor substrate can be used in various semiconductor devices including light emission elements, such as light emitting diodes and laser oscillators, circuit elements, such as field effect transistors and bipolar transistors, and light reception elements.

Although the present invention has been described in connection with the above-described preferred embodiments, the present invention is not limited to the above embodiments. For example, although the base substrate having the Zn plane (+ c-plane) is used in the embodiments, a base substrate having the O plane (− c-plane) may also be used. Also in this case, similar effects can be obtained by appropriately setting a surface inclination angle along the m-axis or a-axis direction. Further, the ZnO based compound semiconductor referred to in this application may include various controlled or uncontrolled impurities and/or elementary substitutions.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What we claim are:

1. A ZnO based compound semiconductor substrate comprising:
    a base substrate of ZnO single crystal having a principal surface made of a plurality of terraces of (0001) planes disposed stepwise in a sequence along an m-axis direction, an envelop of the principal surface having an inclination angle of about 2 degrees or less relative to the (0001) plane; and
    an epitaxially grown layer made of ZnO based compound semiconductor formed over the principal surface of said base substrate.

2. The ZnO based compound semiconductor substrate according to claim 1, wherein the inclination angle of the envelope of the terraces of said base substrate is between about 0.1 degrees and about 1 degrees relative to the (0001) plane.

3. The ZnO based compound semiconductor substrate according to claim 1, further comprising a buffer layer including ZnO on said principal surface of said base substrate and below the epitaxially grown layer.

4. The ZnO based compound semiconductor substrate according to claim 1, wherein the epitaxially grown layer has an electron mobility of about 100 $cm^2/V$ s or more.

5. The ZnO based compound semiconductor substrate according to claim 1, wherein the epitaxially grown layer has an RMS surface roughness of about 1 nm or less.

6. The ZnO based compound semiconductor substrate according to claim 1, wherein a height of steps connecting adjacent terraces of (0001) planes in said principal surface of said base substrate corresponds to a thickness of a two-molecule layer.

* * * * *